United States Patent [19]

Schroder

[11] Patent Number: 4,700,846
[45] Date of Patent: Oct. 20, 1987

[54] APPARATUS FOR MOUNTING PRINTED CIRCUIT BOARDS ON AN INSTRUMENT RACK

[75] Inventor: Joris Schroder, Lucerne, Switzerland

[73] Assignee: Inventio AG, Hergiswil, Switzerland

[21] Appl. No.: 917,688

[22] Filed: Oct. 10, 1986

[30] Foreign Application Priority Data

Oct. 17, 1985 [CH] Switzerland ............... 04483/85

[51] Int. Cl.$^4$ .............................................. A47F 7/00
[52] U.S. Cl. ........................................ 211/41; 211/94; 361/415
[58] Field of Search ............... 211/41, 40, 94, 162, 211/26; 361/415, 412, 397

[56] References Cited

U.S. PATENT DOCUMENTS 3,425,568  2/1969  Albright ..................... 211/94 X
4,467,925  8/1984  Ratzloff et al. ............. 248/214 X

FOREIGN PATENT DOCUMENTS 558254   6/1958  Canada ........................ 211/26
1426320 12/1965  France ........................ 211/41

Primary Examiner—Robert W. Gibson, Jr.
Attorney, Agent, or Firm—Marshall & Melhorn

[57] ABSTRACT

A mounting for printed circuit boards includes a plurality of holders arranged on support rails of an instrument rack, where each holder of a holder pair associated with a printed circuit board is arranged on an adjacent support rail and where the support rails run parallel to each other. The edges of the support rails are formed as outwardly extending flanges engaged by opposed grooves in the body of the holder. The holders also have a clamping device cooperating with the grooves for affixing the holders to the support rails. Prior to the clamping, the positions of the holders can be matched by shifting them along the support rails to the selected locations of the individual printed circuit boards. In one embodiment, the clamping device is a flexible web extending between panels containing the grooves and a set screw extending through the holder body into threaded engagement with the web. In another embodiment, the web is rigid and the set screw threadably extends through the web into engagement with the support rail.

18 Claims, 5 Drawing Figures

APPARATUS FOR MOUNTING PRINTED CIRCUIT BOARDS ON AN INSTRUMENT RACK

BACKGROUND OF THE INVENTION

The invention relates to a mounting apparatus for printed circuit boards arranged on an instrument rack and, in particular, to selectively moveable holders attached to the instrument rack and having guide grooves into which the printed circuit boards are inserted.

A mounting apparatus for superimposed printed circuit boards is known in which an assembly is formed of two mountings, one plug connector, one holding plate and one mounting plate. This assembly is affixed to an instrument rack support rail in such a manner, that a printed circuit board inserted into the guide grooves of the mounting extends in the longitudinal direction of the support rail. When the support rails are arranged normally in the horizontal position this can lead to deposits and thus to contaminations of the printed circuits. Besides that, the relatively expensive type of construction and assembly of this mounting can lead, in particular in the case of extensive instrument racks which exhibit a larger number of printed circuits, to considerable cost increases.

It is therefore an object of the invention to create a mounting for superimposed printed circuit boards which can be assembled in a shorter time, and in which a contamination of the printed circuits is largely avoided, without the use of additional coverings, as compared to prior art mountings.

SUMMARY OF THE INVENTION

The present invention concerns a mounting apparatus in which each holder of a holder pair associated with a printed circuit board is arranged on one of a pair of support rails on an instrument rack, with the support rails running parallel to each other in a horizontal direction. The edges of the support rails engage grooves provided on the holders. The holders include a clamping device, by means of which they can be clamped on the support rails after placement and selective positioning. The advantages realized by the invention are, that the holders can be placed in shortest time at arbitrary points on the support rails, and can be shifted and clamped tight corresponding to the desired final position of the printed circuit board.

Since the mounting of a printed circuit board to already existing support rails requires only two identical holders, the result is a relatively low cost of materials. With a horizontal arrangement of the support rails, the printed circuit boards extend vertically whereby contamination by deposits is largely avoided. If the mounting according to the invention is designed to use standard rails, there results further advantages, because the holders, together with the commercial line-up terminals and other component parts suitable for attachment on standard rails can be arranged in any arbitrary sequence on these rails.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
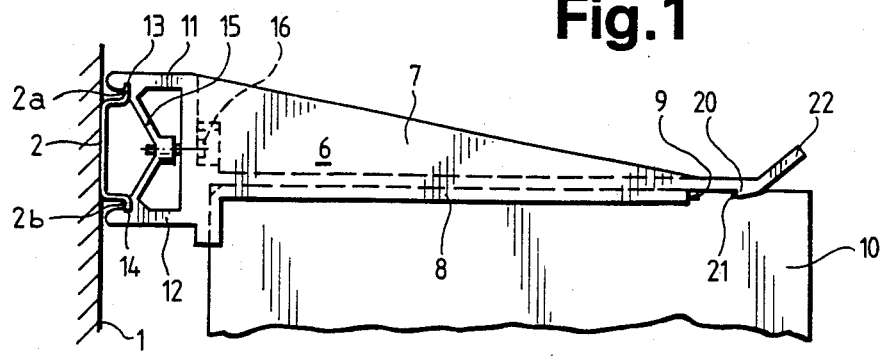
FIG. 1 is a side elevational view of an upper holder of a mounting according to the present invention.
Figure 2:
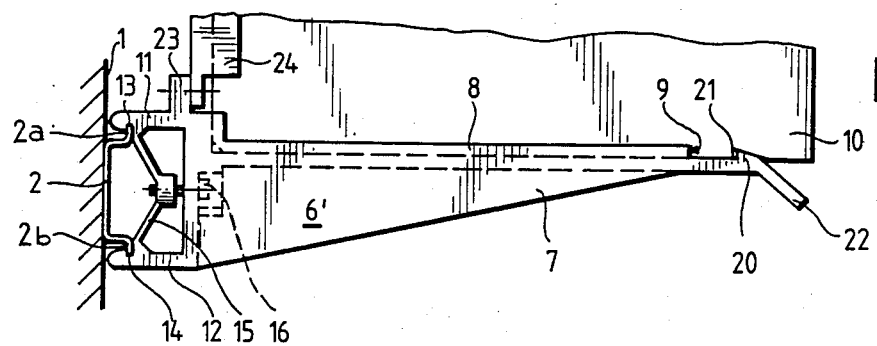
FIG. 2 is a side elevational view of a lower holder of a mounting according to the present invention.
Figure 3:
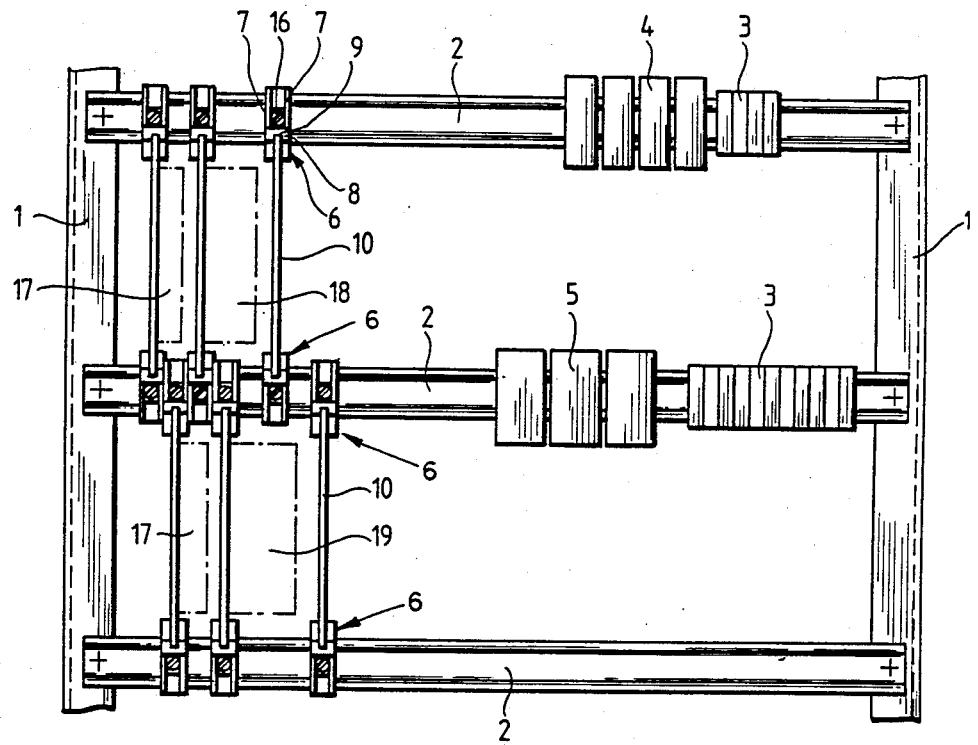
FIG. 3 is a front elevational view, at reduced scale, of several mountings of the type shown in FIGS. 1 and 2.

FIGS. 1 and 2 show the upper and lower holders respectively of a mounting according to the present invention. FIG. 3 shows a plurality of such mountings positioned adjacent one another on an instrument rack. A commercially available instrument rack may typically be formed as a pair of vertically extending, spaced apart side posts 1 between which extend a plurality of horizontally extending, spaced apart support rails 2. The support rails 2 extend generally parallel to one another and have opposite ends affixed in any conventional manner to the instrument rack posts 1. Each of the support rails 2 has a generally U-shaped cross section as best shown in FIGS. 1 and 2. However, at the outer end of each leg of the support rail 2, there is formed an outwardly extending flange or edge portion 2a and 2b. Each of the flanges 2a and 2b extends the full length of the support rail and generally lies in a plane parallel to the facing surfaces of the instrument rack posts 1 to which the rails are attached.

The support rails 2 are designed to retain many commercially available devices such as electrical connecting terminals 3, electrical relays 4, or other electrical component parts as shown in FIG. 3. Also shown on the support rails 2 are a plurality of holders 6 and 6' for retaining printed circuit boards. Each of the holders 6 and 6' includes a generally horizontally extending guide rail 8 formed at right angles to the longitudinal axis of the support rails 2. If the holder 6 is being utilized to hold the upper edge of a printed circuit board such as shown in FIG. 1, an upwardly extending generally triangularly shaped rib 7 is formed in pairs to function as braces on either side of the guide rail 8. If the holder 6' is being utilized along the lower edge of a printed circuit board, the pair of ribs 7 extend generally downwardly from the guide rail 8 as shown in FIG. 2. On the side of the guide rail 8 opposite the ribs 7, a guide groove 9 is formed having a longitudinally extending axis parallel to the longitudinal axis of the guide rail 8. The guide grooves 9 are sized to accept the edges of a standard printed circuit board 10 with a lower edge of the board 10 being retained in the upwardly facing guide groove 9 of the lower holder 6' and the upper edge of the board 10 being retained in the downwardly facing guide groove 9 of the upper holder 6.

In FIG. 3, the middle one of the support rails 2 functions to maintain holders 6 for supporting lower edges of printed circuit boards 10 having their upper edges supported in holders 6 on the upper support rail 2 and also maintain holders 6 for supporting the upper edge of printed circuit boards 10 having their lower edges supported in holders 6 on the lower one of the support rails 2. Typically, the holders 6 are arranged alternately on the middle rail 2. The holders 6 are attached directly on the support rails 2 in a manner similar to the commercially available electrical connecting terminals 3. For example, elastic side panels 11 and 12 are formed as a pair of generally horizontally extending legs extending from the main body of the holder 6 in a direction opposite that of the guide rail 8. Near the outer ends of the side panels 11 and 12 are formed a pair of inwardly facing opposed grooves 13 and 14 respectively which are sized to engage the flanges 2a and 2b respectively. The side panels 11 and 12 are connected together near the grooves 13 and 14 by an elastic web 15.

A set screw 16 extends through the body of the holder 16 and threadably engages a central portion of the elastic web 15. Thus, the set screw 16 can be turned so as to pull the elastic web 15 closer to the central body of the holder 6 thereby tending to force the side panels 11 and 12 together and tightly engage the grooves 13 and 14 with the flanges 2a and 2b respectively to maintain the holders 6 in position on the support rail 2. It can be seen therefore that the set screw 16 is initially threaded into the elastic web 15 so as to allow each of the holders 6 to easily be positioned along the corresponding one of the support rails 2. When the desired position for the holder 6 is determined, the set screw 16 is threaded into the web 15 to firmly attach the holder 6 to the support rail 2. The position for each of the holders 6 depends upon the desired spacing for the printed circuit boards 10 which can be affected by the size of the components mounted on the printed circuit boards 10. For example, there is shown in FIG. 3 typical component outlines 17, 18 and 19 which require different spacing for each associated adjacent pair of printed circuit boards 10.

The outer end of each of the guide rails 8 is absent the guide groove 9 and its surrounding walls. Spaced from the end of the guide groove 9 is a protrusion 20 formed on the same side of the guide rail 8. This protrusion engages and cooperates with a notch 21 formed in the edge of the printed circuit board 10 when the board has engaged the guide groove 9 and is adjacent the central body portion of the holder 6. The guide rail 8 is formed with a bend 22 at its outer end which bend 22 extends in a direction opposite to that of the protrusion 20. The bend 22 can be utilized as a lever arm to which force can be applied to bend the guide rail 8 sufficiently away from the edge of the printed circuit board 10 to release the protrusion 20 from the notch 21 and enable the circuit board 10 to be removed from the guide groove 9.

The holder 6' in FIG. 2 can be provided with a lug 23 extending from an outer face of the side panel 11 to which one end of a standard printed circuit board edge plug connector 24 can be attached by any conventional means. Although not shown, the other end of the plug connector 24 would be attached to a corresponding lug 23 formed on another one of the holders 6' cooperating with an upper edge of the printed circuit board 10. The only difference between the holders 6 and 6' is the lug 23 and either of the holders 6 and 6' can be utilized as an upper or a lower holder.

Figure 4:
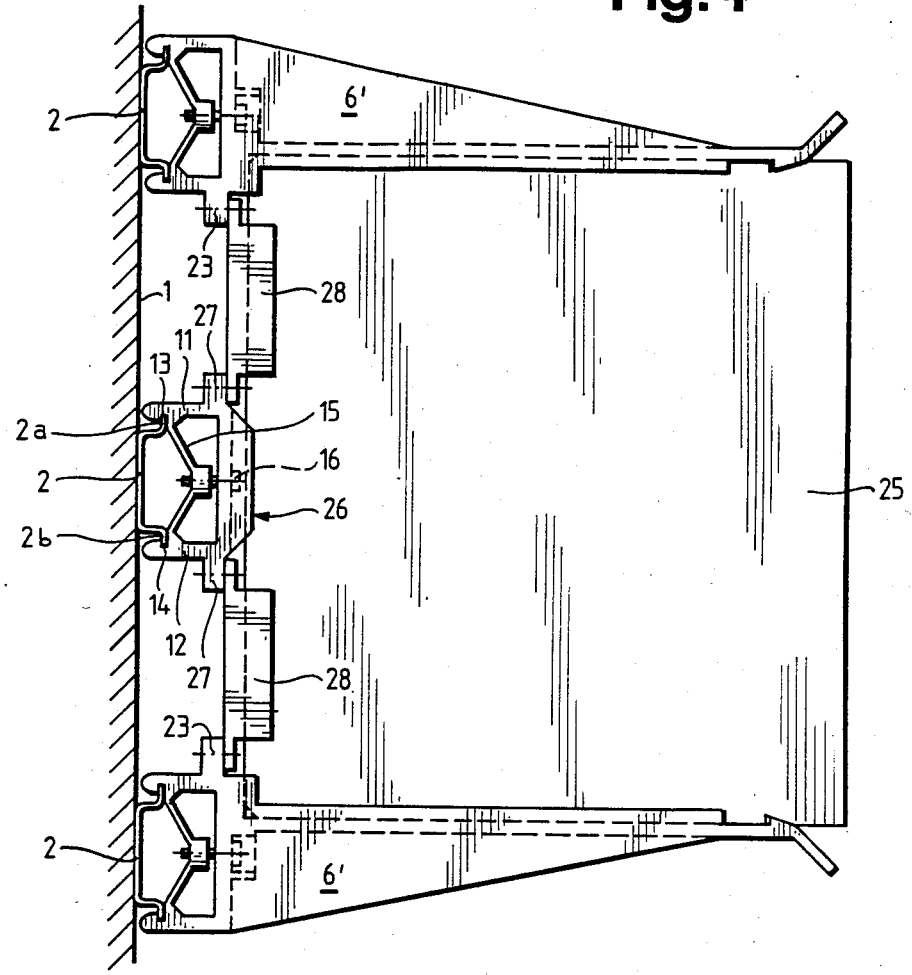
FIG. 4 is a side elevational view of the mounting shown in FIGS. 1 and 2 with two plug connectors.

There is shown in FIG. 4 a pair of the holders 6' for a relatively wide printed circuit board 25. An upper one of the holders 6' is attached to an upper support rail 2 and a lower one of the holders 6' is attached to a lower one of the support rails 2. A plug connector holder 26 is provided on the middle support rail 2. The holder 26 includes the elastic side panels 11 and 12 with the corresponding grooves 13 and 14 for engaging the flanges 2a and 2b respectively. Also included is the elastic web 15 and the set screw 16 for retaining the holder 26 in place along the support rail 2. The holder 26 also has a pair of oppositely extending lugs 27 which are similar to the lug 23. Each of the lugs 27 cooperates with one of the lugs 23 of the associated holder 6' to retain an associated end of one of a pair of plug connectors 28. Plug connectors 28 engage the adjacent edge of the printed circuit board 25 which is retained by the pair of holders 6'. The holder 26 can also include a groove for retaining an adjacent edge of the printed circuit board 25.

Figure 5:
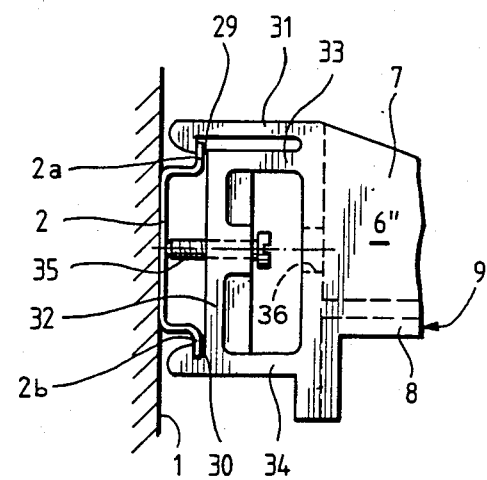
FIG. 5 is an enlarged side elevational view of a portion of a holder according to an alternate embodiment of the invention mounted on a support rail.

There is shown in FIG. 5 an alternate embodiment of the present invention as a holder 6" in which a pair of opposed grooves 29 and 30 are provided for engaging the flanges 2a and 2b respectively. The groove 29 is formed between the end of a stop lever 31 extending from the central body portion of the holder 6" and a web 32 which extends between side panels 33 and 34 which are similar to the side panels 11 and 12 shown in FIGS. 1 and 2. The groove 30 is formed in the end of the side panel 34. A set screw 35 threadably engages a central portion of the web 32 and extends into engagement with a central portion of the support rail 2. As the set screw 35 is threaded into the web 32, the holder 6" will tend to be forced away from the support rail 2 thereby clamping the ends of the stop lever 31 and side panel 30 firmly against the flanges 2a and 2b to retain the holder 6" in position. The threaded head of the set screw 35 can be accessed through a hole or aperture 36 formed in the central body portion of the holder 6". Although printed circuit boards 10 and 25 have been utilized as examples of elements which can be retained by the holders 6, 6' and 6", it shall be understood that any elements provided with opposed edges which can be engaged by the guide grooves 9 can be inserted into and retained by the holders.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An apparatus for mounting printed circuit boards on an instrument rack having support rails, including a pair of holders for engaging opposed edges of a printed circuit board, each of the holders comprising:
    a body having a pair of facing flange engaging grooves formed therein adapted to slidably engage a pair of outwardly extending flanges formed on an instrument rack support rail;
    a guide groove formed in said body and adapted to engage an edge of a printed circuit board; and
    clamping means on said body cooperating with said flange engaging grooves for selectively preventing relative movement between the holder and an instrument rack support rail.

2. The apparatus according to claim 1 including a lug formed on said body and adapted for attachment to an electrical plug.

3. The apparatus according to claim 1 including a pair of spaced apart side panels attached to said body, each of said side panels having one of said flange engaging grooves formed therein, a flexible web attached to and extending between said side panels, and a set screw extending through said body and threadably engaging said web whereby when said set screw is rotated to move said web toward said body, said side panels are moved toward one another to firmly clamp flanges on a support rail to which said holder is attached in said flange engaging grooves.

4. The apparatus according to claim 1 including a pair of spaced apart side panels attached to said body, one of said side panels having one of said flange engaging grooves formed therein and the other one of said side panels cooperating with a stop lever formed on said body to define the other one of said flange engaging grooves, a web attached to and extending between said side panels, and a set screw threadably engaged in said web whereby when said set screw is rotated to engage a surface of a support rail to which said holder is attached, said side panels and said body are moved away from the support rail to firmly clamp flanges formed on the support rail in said flange engaging grooves.

5. The apparatus according to claim 4 wherein said stop lever extends from said body generally parallel to the other one of said side panels.

6. The apparatus according to claim 1 wherein said body includes a guide rail extending therefrom and having said guide groove formed therein.

7. The apparatus according to claim 6 wherein said guide rail has a protrusion formed thereon spaced from an end of said guide groove and adapted to engage a notch formed in an edge of a printed circuit board for retaining the printed circuit board in said guide groove.

8. The apparatus according to claim 7 wherein said guide arm has an end portion thereof adjacent said protrusion and bent away from said guide groove whereby pressure applied to said bent end portion forces said protrusion from the notch thereby releasing the printed circuit board for removal from said guide groove.

9. An apparatus for mounting a plurality of printed circuit boards on an instrument rack having at least three spaced apart support rails including a plurality of holders for engaging edges of printed circuit boards, comprising:
   each of the holders having a body with a pair of opposed flange engaging grooves formed therein adapted to slidably engage a pair of outwardly extending flanges formed on an instrument rack support rail;
   each said holder body having a guide groove formed therein and adapted to engage an edge of a printed circuit board; and
   clamping means on each said holder body cooperating with said flange engaging grooves and selectively preventing relative movement between the holder and a support rail wherein at least first, second and third ones of said holders each engage a different support rail for retaining at least one printed circuit board.

10. The apparatus according to claim 9 wherein said first holder and said second holder are positioned with associated ones of said guide grooves facing each other and each engaging an opposed edge of the one printed circuit board, and including a fourth one of said holders engaging a support rail and adjacent said second holder with associated ones of said guide grooves of said second and fourth holders facing each other and each engaging an opposed edge of another printed circuit board.

11. The apparatus according to claim 9 wherein said first and third holders are positioned with associated ones of said guide grooves facing each other and each engaging an opposed edge of the one printed circuit board, and said second holder is positioned between said first and third holders and includes a pair of lugs formed on said body adapted to be attached to a pair of plug connectors.

12. The apparatus according to claim 11 wherein each of said first and third holders includes a lug formed on its said body adapted to be attached to a plug connector.

13. A printed circuit board holder for use with a support rail in an instrument rack, comprising:
   a body having a pair of opposed flange engaging grooves formed therein for engaging a pair of outwardly extending flanges formed on a support rail;
   clamping means on said body cooperating with said flange engaging grooves for selectively preventing relative movement between said body and an associated support rail having flanges engaged by said opposed flange engaging grooves;
   a guide rail extending from said body and defining a guide groove adapted to engage an edge of a printed circuit board;
   a protrusion formed on said guide rail and spaced from an end of said guide groove and adapted to engage a notch formed in an edge of a printed circuit board in said guide groove; and
   an end portion of said guide rail adjacent to said protrusion and bent away from said guide groove whereby pressure applied to said bent portion forces said protrusion from the notch thereby releasing the printed circuit board from said guide groove.

14. The holder according to claim 13 wherein said body has a lug formed thereon and adapted for attachment to an electrical plug.

15. The holder according to claim 13 wherein said body includes a pair of spaced apart side panels each having one of said opposed flange engaging grooves formed therein, a web attached to and extending between said side panels, and a set screw threadably engaging said web whereby when said set screw is threaded into said web, said opposed flange engaging grooves firmly clamp outwardly extending flanges formed on a support rail to prevent relative movement between the holder and a support rail.

16. The holder according to claim 15 wherein said set screw extends through said body and threadably engages said web, said web being flexible.

17. The holder according to claim 15 wherein said set screw threadably extends through said web and engages a support rail.

18. The holder according to claim 17 wherein said body includes a flexible stop lever formed therein and cooperating with one of said side panels for defining one of said opposed flange engaging grooves.

* * * * *